(12) United States Patent
Suzuki

(10) Patent No.: US 12,255,198 B2
(45) Date of Patent: Mar. 18, 2025

(54) LAYOUTS OF DATA PADS ON A SEMICONDUCTOR DIE

(71) Applicant: Micron Technology, Inc., Boise, ID (US)

(72) Inventor: Takamasa Suzuki, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 389 days.

(21) Appl. No.: 17/646,565

(22) Filed: Dec. 30, 2021

(65) Prior Publication Data

US 2023/0215858 A1    Jul. 6, 2023

(51) Int. Cl.
*H01L 27/02* (2006.01)
*G11C 5/06* (2006.01)
*H01L 25/065* (2023.01)

(52) U.S. Cl.
CPC .......... *H01L 27/0207* (2013.01); *G11C 5/063* (2013.01); *H01L 25/0657* (2013.01)

(58) Field of Classification Search
CPC ......... H01L 21/50; H01L 21/60; H01L 25/18; H01L 27/11898; G11C 5/063; G06F 13/16
USPC ......................................................... 257/52
See application file for complete search history.

(56) References Cited

U.S. PATENT DOCUMENTS

| | | | |
|---|---|---|---|
| 8,981,808 B2 | 3/2015 | Nishioka | |
| 2010/0271071 A1* | 10/2010 | Bartley | H01L 25/0657 |
| | | | 326/101 |
| 2011/0037158 A1* | 2/2011 | Youn | H01L 24/33 |
| | | | 257/692 |

* cited by examiner

*Primary Examiner* — Fazli Erdem
(74) *Attorney, Agent, or Firm* — TraskBritt

(57) ABSTRACT

Layouts of data pads and dummy data pads are disclosed. A die may include a number of circuits, a first edge, a second edge perpendicular to the first edge, a third edge opposite the first edge, and a fourth edge. The die may further include a first number of data pads variously electrically coupled to the number of circuits and arranged proximate to the first edge and a first number of dummy data pads, not electrically coupled to the number of circuits, alternatingly arranged with the first number of data pads, and proximate to the first edge. The die may further include a second number of data pads arranged proximate to the third edge and a second number of dummy data pads, alternatingly arranged with the second number of data pads, and proximate to the third edge. Associated devices, systems, and methods are also disclosed.

16 Claims, 8 Drawing Sheets

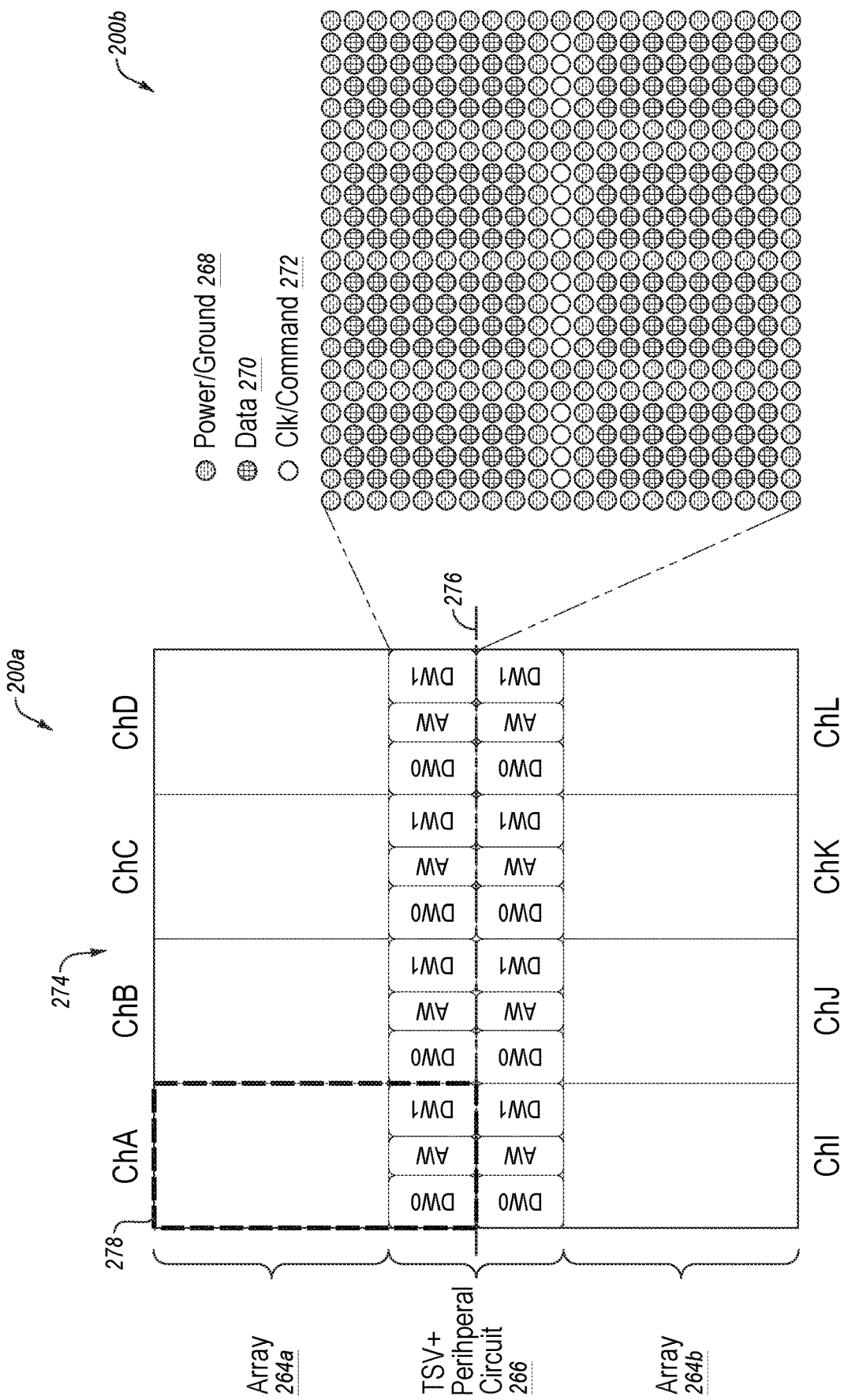

LAYOUTS OF DATA PADS ON A SEMICONDUCTOR DIE

TECHNICAL FIELD

Embodiments of the disclosure relate to semiconductor-die layouts, and more specifically to layouts of data pads on a semiconductor die. Yet more specifically, various embodiments relate to layouts of data pads, dummy data pads, and common data pads on a die to allow for stacking of a number of dies. Additionally, embodiments include related methods, devices, and systems.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

Some memory devices include two or more dies stacked one on another. The memory devices may provide for independent communication with each of the dies.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 2A is a functional block diagram illustrating an example layout of a die in accordance with at least one embodiment of the disclosure.

FIG. 2B is a functional block diagram illustrating an example layout of pads of an example DW area of the die of FIG. 2A in accordance with at least one embodiment of the disclosure.

DETAILED DESCRIPTION

Figure 1:
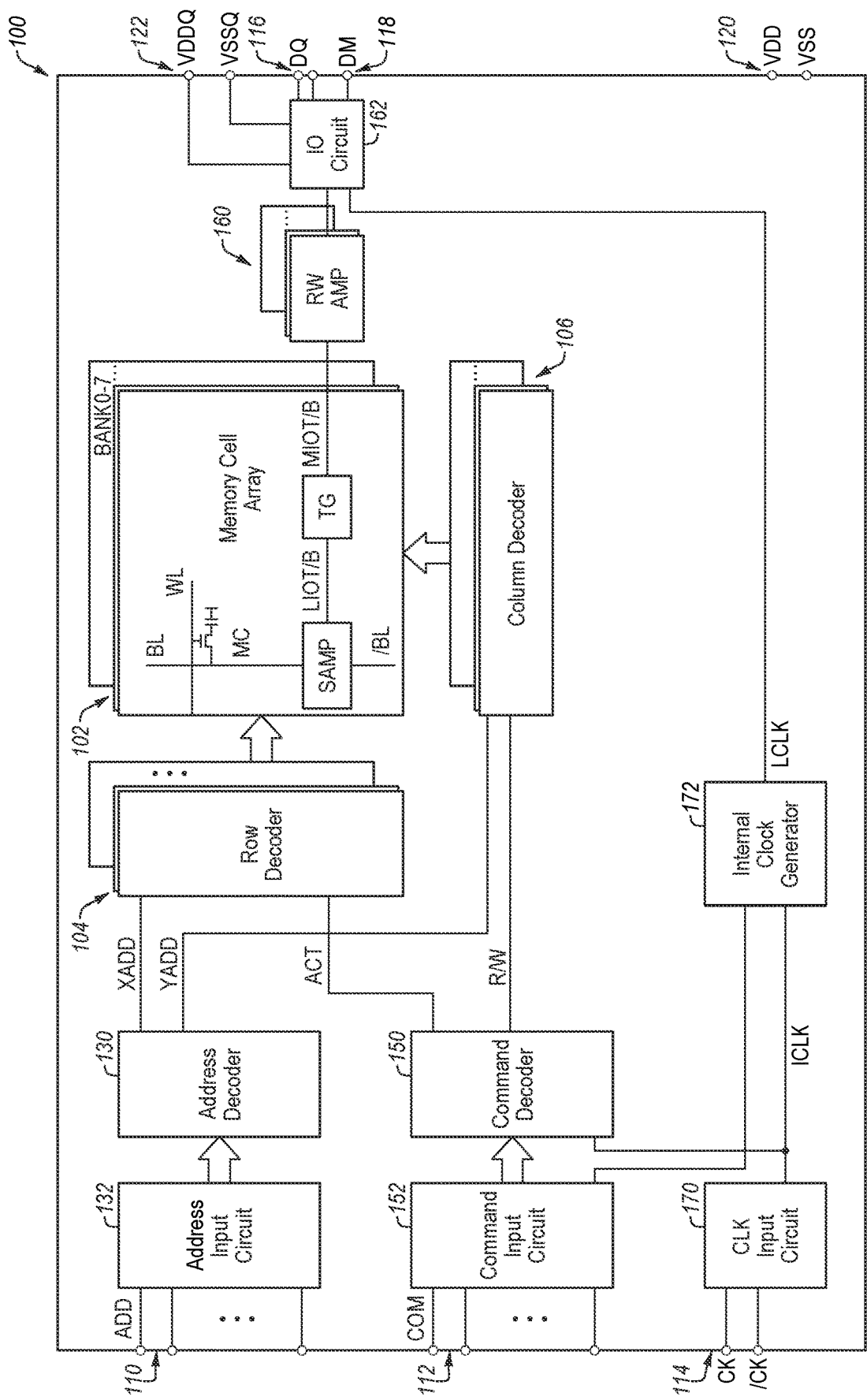
FIG. 1 is a functional block diagram illustrating an example memory device, in accordance with at least one embodiment of the disclosure.

Some devices and/or systems, e.g., memory devices and/or memory systems, may include two or more stacked dies (also commonly referred to as "dice"). A device may provide one or more independent communication channels for each of the dies. For example, a memory device may include two or more dies with one or more memory arrays on each of the dies. To enable the various memory arrays to be used independently (e.g., to enable each of the memory arrays to store and retrieve data independent of the other memory arrays), the memory device may include one or more independent data channels for each of the memory arrays. The data channels may allow data to be written to and to be read from the memory arrays. Data channels may traverse, among other things, inter-layer connections, data pads, and dummy data pads. In the present disclosure the terms "data pad" and "dummy data pad" each refer to a node for electrical connection that is present on both a front side and a back side of a die. Data pads and dummy data pads may include upper metal-layer pads, silicon-bulk-side pads, and through-silicon vias.

Some embodiments of the present disclosure include a layout (e.g., an arrangement) of data pads and dummy data pads for a die that allow substantially identical copies of the die to be stacked while providing independent data channels for memory arrays on the dies. For example, a first die may include a first data pad in its top left corner and a first dummy data pad in its bottom right corner. The first data pad may be electrically coupled to a first circuit of the first die and the first dummy data pad may not be electrically coupled to the first circuit (in some embodiments, the first dummy data pad may be electrically isolated). A second die, which is a substantially identical copy of the first die, may include a second data pad in its top left corner and a second dummy data pad in its bottom right corner. The second data pad may be electrically coupled to a second circuit of the second die and the second dummy data pad may not be electrically coupled to the second circuit (in some embodiments, the second dummy data pad may be electrically isolated). The second die may be rotated substantially 180° around an axis normal to the first die and stacked above the first die such that the second dummy data pad of the second die is above the first data pad of the first die and the second data pad of the second die is above the first dummy data pad of the first die. A first inter-layer connection may electrically couple a first input/output of the stack of dies to the second dummy data pad of the second die and to the first data pad of the first die. A second inter-layer connection may electrically couple a second input/output of the stack of dies to the first dummy data pad of the first die and to the second data pad of the second die. Because the second dummy data pad is not electrically coupled to the second circuit (and/or is electrically isolated relative to the second die), the first input/output may provide a first independent data channel for the first circuit (e.g., of a first memory array) of the first die. Further, because the first dummy data pad is not electrically coupled to the first circuit (and/or is electrically isolated relative to the first die), the second input/output may provide a second independent data channel for the second circuit (e.g., of a second memory array) of the second die.

The example layout described above may be expanded to include several data pads and several corresponding dummy data pads allowing for several dies to be stacked and providing an independent data channel for each memory array of each of the several dies. In some embodiments, an inter-layer connection may be electrically coupled to multiple data pads of multiple dies. In such cases, addressing may be applied to individually access circuits (e.g., circuits of memory arrays) of the multiple dies. For example, four dies may be stacked in two different orientations (e.g., one of the orientations rotated substantially 180° relative to the other). Each of the four dies may include two data pads and two dummy data pads. Four inter-layer connections may be electrically coupled to the data pads of the four dies. For example, at a first die (e.g., a bottom die) the inter-layer connections may be electrically coupled to each of the two data pads and to the two dummy data pads. At a second die, above the first die, the inter-layer connections electrically coupled to the data pads of the first die may be electrically coupled to dummy data pads of the second die and the inter-layer connections electrically coupled to the dummy data pads of the first die may be electrically coupled to data pads of the second die. At a third die, above the second die, the inter-layer connections electrically coupled to the data pads of the second die may be electrically coupled to dummy data pads of the third die and the inter-layer connections electrically coupled to the dummy data pads of the second die may be electrically coupled to data pads of the third die. At a fourth die, above the third die, the inter-layer connections electrically coupled to the data pads of the third die may be electrically coupled to dummy data pads of the fourth die and the inter-layer connections electrically coupled to the dummy data pads of the third die may be electrically coupled to data pads of the fourth die. A device (e.g., an "accessing device"), such as a controller and/or a host, may be configured to provide inputs to and/or to receive outputs from one or more memory arrays of one or more of the four dies through unique inter-layer connections as part of a data channel for each of the dies. For example, the accessing device may use a first inter-layer connection electrically coupled to a data pad of the first die, a dummy data pad of the second die, a data pad of the third die, and a dummy data pad of the fourth die to provide inputs to and/or to receive outputs from a memory array of the first die. In addition, the accessing device may use a second inter-layer connection that is also electrically coupled to a data pad of the first die, a dummy data pad of the second die, a data pad of the third die, and a dummy data pad of the fourth die to provide inputs to and/or to receive outputs from a memory array of the third die.

As another example, a first die may include a first data pad in its top left corner, a first dummy data pad in its top right corner, a second dummy data pad in its bottom right corner, and a third dummy data pad in its bottom left corner. In this example, three additional die, each identical to the first, may be stacked above the first die, each rotated substantially 90° relative to the die beneath it. This may allow four identical die to be stacked while providing four independent data channels through four inter-layer connections. The example layout suitable for substantially 90° rotations may be expanded using more than one data pad and more than three dummy data pads per die to allow more than four dies to be stacked while providing individual data channels in similar fashion to what was described in the previous example.

Additionally or alternatively, a device may use additional data channels to provide data to all dies of a stack of dies. In the present disclosure, data channels to provide data to all dies of a stack are referred to as "common data channels." Examples of common data channels include data channels for communicating test-mode signals and reset signals. Additionally or alternatively, power and ground may be provided through common data channels. Likewise, inter-layer connections configured to communicate common data channels may be referred to herein as "common inter-layer connections" and data pads intended to be electrically coupled to common inter-layer connections may be referred to as "common data pads." A device may use several different categories of common data channels (e.g., for carrying different categories of signals) and dies of the device may include several corresponding categories of common data pads, e.g., a first category of common data pad configured for a first category of common data channel and a second common data pad configured for a second category of common data channel.

Some embodiments of the present disclosure may include a layout of categories of common data pads for a die that allow substantially identical copies of the die to be rotated relative to one another and stacked. For example, a die may include a first common data pad of a first category proximate to a top left corner of the die and a second common data pad of a second category proximate to the first common data pad. The die may further include a third common data pad of the first category proximate to a bottom right corner of the die and a fourth common data pad of the second category proximate to the third common data pad. The position of the first common data pad relative to the top left corner may be the reverse as the position of the third common data pad relative to the bottom right corner and the position of the second common data pad relative to the top left corner may be the reverse as the position of the fourth common data pad relative to the bottom right corner. The relative positions of the die may be such that if a substantially identical copy of the die is placed above the die, the first common data pad of the die will align with the third common data pad of the copy of the die and the second common data pad of the die will align with the fourth common data pad of the copy of the die.

Such a layout (i.e., a layout that allows for alignment of data pads and dummy data pads and/or the alignment of categories of common data pads) may allow inter-layer connections to be straight (e.g., vertical through the stack) and without any lateral-connection portions. Straight inter-layer connections without lateral-connection portions may decrease parasitic capacitance compared with other stacks of dies including lateral-connection portions. Further, a layout decreasing the number of, or not including, lateral-connection portions, may have other advantages when compared with layouts including lateral-connection portions including decreased complexity and/or decreased manufacturing time and/or cost.

Further, such a layout (i.e., layout that allows for alignment of data pads and dummy data pads and/or of categories of common data pads) may allow multiple instances of similar or identical dies to be stacked. This may allow for producing a stack of dies more simply and/or economically.

A data pad may be configured for a particular data channel or common data channel based on which circuits of the die the data pad is electrically coupled to on the die. For example, a data pad electrically coupled to an input/output circuit of a memory array may be a data pad for a data channel. Another data pad electrically coupled to an address input circuit of a memory array may be a data pad for receiving address information.

On the other hand, a dummy data pad may be defined by its lack of electrical coupling to circuits on the die. For example, in some embodiments, dummy data pads of a die may be electrically isolated from everything on the die. Thus, an inter-layer connection may electrically couple to a dummy data pad of a first die and to a data pad of a second die without electrical signaling on the first die interfering with a signal carried to, or from, the data pad of the second die.

Although various embodiments are described herein with reference to memory devices, the disclosure is not so limited, and the embodiments may be generally applicable to microelectronic systems and/or semiconductor devices that may or may not include memory devices. Embodiments of the disclosure will now be explained with reference to the accompanying drawings.

FIG. 1 is a functional block diagram illustrating an example memory device 100, in accordance with at least one embodiment of the disclosure. Memory device 100 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a three-dimensional (3D) DRAM. Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or/BL.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and/CK may be received via clock terminals 114. A CLK Input circuit 170 may generate internal clock signals ICLK based on the clock signals CK and/CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

FIG. 2A is a functional block diagram illustrating an example layout 200a of a die 274 in accordance with at least one embodiment of the disclosure. Layout 200a includes an array area 264a, array area 264b, and through-silicon via (TSV) and peripheral circuit area 266 close to a center line 276 of die 274.

Additionally, layout 200a includes designations of areas of the die for specific channels ("channel areas"), e.g., Channel A ("ChA"), Channel B ("ChB"), Channel C ("ChC"), Channel D ("ChD"), Channel I ("ChI"), Channel J ("ChJ"), Channel K ("ChK"), and Channel L ("ChL"). Including multiple channels on a die may, among other things, increase the granularity with which memory cells can be accessed. Including multiple channels may improve random-access operations. Each of the channel areas may include a portion of an array area 264a or array area 264b and a portion of TSV and peripheral circuit area 266. As an example, ChA area 278 is illustrated in FIG. 2A. The TSV and peripheral circuit area 266 of a channel area may be for servicing the memory in the memory array area of the channel area. For example, each channel area may include one "AW" region (or "AWord" region) that may include data pads for receiving address/command data (or a "command block") and two "DW" regions (or "DWord" regions) that may include data pads for providing and/or receiving data (or a "data I/O block").

FIG. 2B is a functional block diagram illustrating an example layout 200b of pads of an example DW area of the die of FIG. 2A in accordance with at least one embodiment of the disclosure. In particular, layout 200b illustrates an arrangement of power/ground pads 268 (which may be used to transfer power to dies), data pads 270 (which may be used to provide data to and/or receive data from dies and, more specifically, from memory arrays of dies), and clock/command pads 272 (which may be used to provide clock signals and/or command signals to dies). Each of the pads of a die may be electrically coupled to inter-layer connections that may couple the pads to other dies and/or to inputs/outputs of the dies. For example, in some embodiments, each of the pads may be, or may include, a TSV.

Figure 2C:
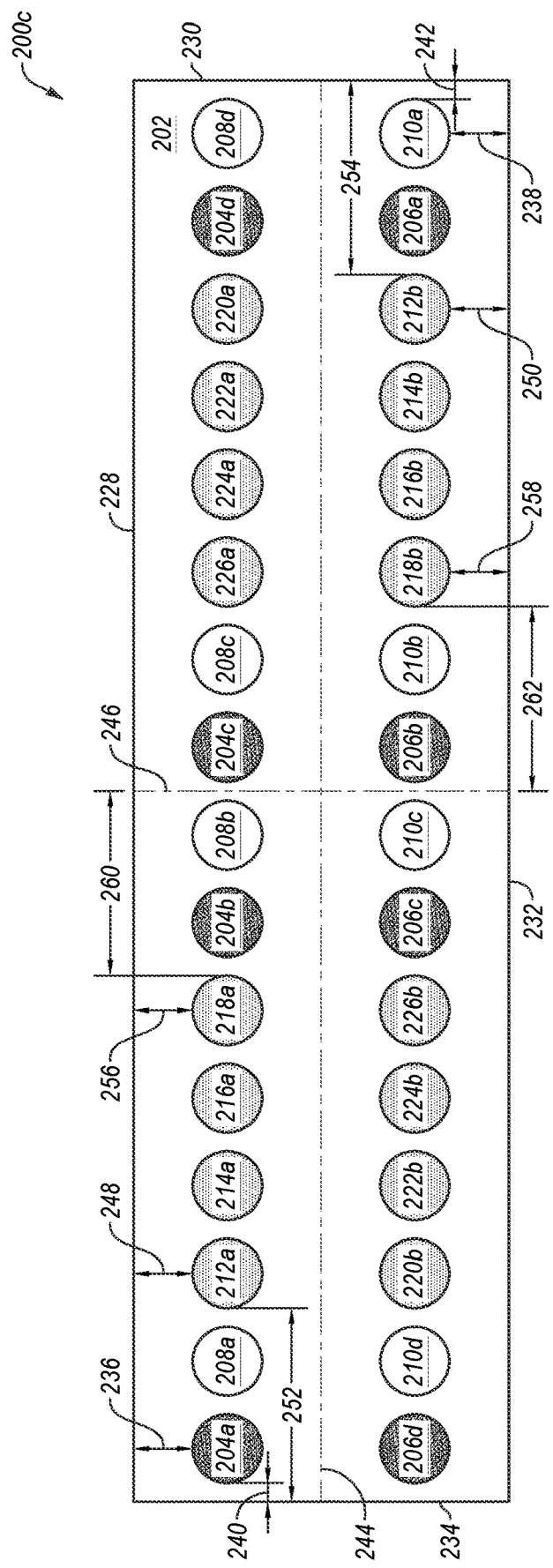
FIG. 2C is a functional block diagram illustrating an example layout of data pads, dummy data pads, and common data pads on an example die in accordance with at least one embodiment of the disclosure.

FIG. 2C is a functional block diagram illustrating an example layout 200c of data pads, dummy data pads, and common data pads on an example die 202 in accordance with at least one embodiment of the disclosure. Layout 200c may allow for multiple instances of die 202 to be rotated relative to one another and to be stacked. A stack of instances of die 202 (e.g., with alternative dies rotated substantially 180° relative one another) may allow for alignment of data pads and dummy data pads and alignment of categories of common data pads which may allow for straight inter-layer connections, e.g., without lateral-connection portions.

Die 202 is illustrated in FIG. 2 without memory arrays and with eight data pads and sixteen common data pads for descriptive purposes. In particular, die 202 and the description of layout 200c relative to die 202 is meant to describe principles and patterns that can be applied to data pads, dummy data pads, and common data pads of any die including any number of data pads, dummy data pads, and common data pads arranged anywhere on the die. For example, the TSV and peripheral circuit area 266 of FIG. 2A as a whole may be arranged according to layout 200c. Further, because the patterns and principles described with regard to layout 200c apply to TSV and peripheral circuit area 266 as a whole, the patterns and principles described with regard to layout 200c may apply within each DW region and/or AW region of TSV and peripheral circuit area 266.

Die 202 may include one or more memory arrays (e.g., memory array 102 of FIG. 1; not illustrated in FIG. 2C) arranged in one or more memory array areas (e.g., array area 264a of FIG. 2A and array area 264b of FIG. 2A; not illustrated in FIG. 2C). The data pads, dummy data pads, and common data pads of layout 200c may be arranged close to a center line of die 202, e.g., close to center line 276 of FIG. 2A with array areas on either side as illustrated in FIG. 2A or, the data pads, dummy data pads, and common data pads of layout 200c may be arranged close to edges of die 202 with one or more memory array areas between them.

The data pads of die 202 may provide for data channels for the memory arrays. For example, the various data pads of die 202 may be variously electrically coupled to various circuits (e.g., input/output circuits) of die 202. For example, data pads may be for electrical coupling to circuits such as, for example, address input circuit 132, command input circuit 152, input/output circuit 162, and/or CLK input circuit 170. Additionally or alternatively, the data pads may be for electrical coupling to terminals such as address terminals 110, command terminals 112, clock terminals 114, data terminals 116, and data mask terminals 118 of FIG. 1. In some embodiments, data channels including data pads may be serialized and/or de-serialized to allow for a reduction in a number of data pads per die and/or to allow for a relaxed data rate.

Die 202 includes a first edge 228, a second edge 230, a third edge 232, and a fourth edge 234. An axis 244 and an axis 246 are illustrated on die 202 for descriptive purpose. Axis 244 may be between first edge 228 and third edge 232 e.g., axis 244 may be substantially the same distance from first edge 228 and third edge 232. Axis 246 may be between second edge 230 and fourth edge 234 e.g., axis 246 may be substantially the same distance from second edge 230 and fourth edge 234.

Die 202 includes data pad 204a, data pad 204b, data pad 204c, and data pad 204d (collectively referred to as "data pads 204") arranged proximate to first edge 228. In the present disclosure, the term "proximate" may mean that a thing (e.g., a data pad, a dummy data pad, or a common data pad) is closer to one location than to the opposite of the location. For example, data pads 204 being proximate to first edge 228 means that data pads 204 are closer to first edge 228 than to third edge 232. In other words, data pads 204 being proximate to first edge 228 may mean that data pads 204 are on the first edge 228 side of axis 244. As an example, a data pad close to a center line of a die (e.g., a data pad close to center line 276 of FIG. 2A) may yet be proximate to a first edge because the data pad is closer to the first edge than to a third edge opposite the first edge. Data pads 204 are illustrated in FIG. 2C as including four data pads for descriptive purposes; any number of data pads 204 may be included in other embodiments. Data pads 204 may be variously electrically coupled to one or more respective circuits of die 202. For example, each of data pads 204 may be electrically coupled to a respective circuit to allow an accessing device to electrical couple (e.g., through an inter-layer connection) to the one or more respective circuits of a memory array.

Die 202 includes dummy data pad 208a, dummy data pad 208b, dummy data pad 208c, and dummy data pad 208d (collectively referred to as "dummy data pads 208") arranged proximate to first edge 228. Dummy data pads 208 may not be electrically coupled to one or more circuits of die 202. In some embodiments, dummy data pads 208 may be electrically isolated from all circuits of die 202. Dummy data pads 208 are illustrated in FIG. 2C as including four dummy data pads for descriptive purposes; any number of dummy data pads 208 may be included in other embodiments. Dummy data pads 208 may be arranged alternatingly with data pads 204. For example, from left to right, data pads 204 and dummy data pads 208 include data pad 204a, dummy data pad 208a, data pad 204b, dummy data pad 208b, data pad 204c, dummy data pad 208c, data pad 204d, and dummy data pad 208d. As another example (not illustrated), groups of data pads 204 may be arranged alternatingly with groups of dummy data pads 208, for example, from left to right, data pads 204 and dummy data pads 208 may include data pad 204a, data pad 204b, dummy data pad 208a, dummy data pad 208b, data pad 204c, data pad 204d, dummy data pad 208c, and dummy data pad 208d. Because of the alternating arrangement of data pads 204 and dummy data pads 208, one of data pads 204 (e.g., data pad 204a) may be proximate to an edge (e.g., fourth edge 234) and one of dummy data pads 208 (e.g., dummy data pad 208d) may be proximate to the opposite edge (e.g., second edge 230).

Die 202 includes data pad 206a, data pad 206b, data pad 206c, and data pad 206d (collectively referred to as "data pads 206") arranged proximate to third edge 232; data pads 206 are illustrated in FIG. 2C as including four data pads for descriptive purposes; any number of data pads 206 may be included in other embodiments. Data pads 206 may be variously electrically coupled to a respective circuit to allow an accessing device to electrical couple (e.g., through an inter-layer connection) to the one or more respective circuits of a memory array.

Die 202 includes dummy data pad 210a, dummy data pad 210b, dummy data pad 210c, and dummy data pad 210d (collectively referred to as "dummy data pads 210") arranged proximate to third edge 232. Dummy data pads 210 may be not electrically coupled to one or more circuits of die 202. In some embodiments, dummy data pads 210 may be electrically isolated from all circuits of die 202. Dummy data pads 210 are illustrated in FIG. 2C as including four dummy data pads for descriptive purposes; any number of dummy data pads 210 may be included in other embodiments. Dummy data pads 210 may be arranged alternatingly with data pads 206. For example, from left to right, data pads 206 and dummy data pads 210 include data pad 206d, dummy data pad 210d, data pad 206c, dummy data pad 210c, data pad 206b, dummy data pad 210b, data pad 206a, and dummy data pad 210a. As another example (not illustrated), groups of data pads 206 may be arranged alternatingly with groups of dummy data pads 210, for example, from left to right, data pad 206d, data pad 206c, dummy data pad 210d, dummy data pad 210c, data pad 206b, data pad 206a, dummy data pad 210b, and dummy data pad 210a. Because of the alternating arrangement of data pads 206 and dummy data pads 210, one of data pads 206 (e.g., data pad 206d) may be proximate to an edge (e.g., fourth edge 234) and one of dummy data pads 210 (e.g., dummy data pad 210a) may be proximate to the opposite edge (e.g., second edge 230).

In some embodiments, the arrangement of data pads 204 and dummy data pads 208 may be symmetrical to the arrangement of data pads 206 and dummy data pads 210 about axis 244. For example, each of data pads 204 may be substantially the same distance from first edge 228 as a corresponding one of data pads 206 is from third edge 232. Likewise, each of dummy data pads 208 may be substantially the same distance from first edge 228 as a corresponding one of dummy data pads 210 is from third edge 232. In some embodiments, all of data pads 204 may be substantially the same distance from first edge 228 and all of data pads 206 may be substantially the same distance from third edge 232. In other embodiments, one or more of data pads 204 may be a first distance from first edge 228 and others of data pads 204 may be a second distance from first edge 228. In such embodiments, a corresponding one or more of data pads 206 may be substantially the first distance from third edge 232 and corresponding others of data pads 206 may be substantially the second distance from third edge 232. Additionally, each of data pads 204 may be substantially the same distance from fourth edge 234 as a corresponding one of data pads 206 is from fourth edge 234. For example, data pad 204a may be the substantially same distance from fourth edge 234 as data pad 206d is from fourth edge 234. Likewise, each of dummy data pads 208 may be substantially the same distance from fourth edge 234 as a corresponding one of dummy data pads 210. For example, dummy data pad 208a may be substantially the same distance from fourth edge 234 as dummy data pad 210d is from fourth edge 234.

Additionally or alternatively, in some embodiments, the arrangement of data pads 204 relative to a top left corner (e.g., where first edge 228 meets fourth edge 234) may be the reverse of the arrangement of dummy data pads 210 relative to a bottom right corner (e.g., where second edge 230 meets third edge 232). For example, data pad 204a may be distance 236 from first edge 228 and distance 240 from the fourth edge 234 and dummy data pad 210a may be distance 238 (which may be substantially the same as distance 236) from third edge 232 and the second distance 242 (which may be substantially the same as distance 240) from second edge 230.

Similarly, the arrangement of dummy data pads 208 relative to a top left corner may be the reverse of the arrangement of data pads 206 relative to a bottom right corner. For example, dummy data pad 208a may be substantially the same distance from first edge 228 as data pad 206a is from third edge 232 and dummy data pad 208a may be substantially the same distance from fourth edge 234 as data pad 206a is from second edge 230.

In some embodiments, all of data pads 204 may be substantially the same distance from first edge 228. In such embodiments, all of dummy data pads 208 may be substantially the same distance from third edge 232. In other embodiments, one or more of data pads 204 may be a first distance from first edge 228 and others of data pads 204 may be a second distance from first edge 228. In such embodiments, a corresponding one or more of dummy data pads 208 may be the first distance from third edge 232 and corresponding others of dummy data pads 208 may be the second distance from third edge 232.

Such an arrangement of data pads 204, data pads 206, dummy data pads 208, and dummy data pads 210 may allow for data pads of a first die to be aligned with dummy data pads of a second die when substantially identical copies of die 202 are rotated and stacked. For example, data pads 204, dummy data pads 208, data pads 206, and dummy data pads 210 may be arranged such that if die 202 were rotated substantially 180° around an axis between first edge 228, second edge 230, third edge 232, and fourth edge 234, data pads 204 would be in positions formerly occupied by the dummy data pads 210, dummy data pads 208 would be in positions formerly occupied by the data pads 206, the data pads 206 would be in positions formerly occupied by the dummy data pads 208, and dummy data pads 210 would be in positions formerly occupied by the data pads 204.

Die 202 includes data pads 212-218 including: data pad 212a and data pad 212b which may be common data pads of a first category, data pad 214a and data pad 214b which may be common data pads of a second category, data pad 216a and data pad 216b which may be common data pads of a third category, and data pad 218a and data pad 218b which may be common data pads of a fourth category. Data pads 212-218 include four categories of common data pads for descriptive purposes. Any number of common data pads and any number of categories of common data pads may be included in other embodiments. Data pads 212a, 214a, 216a, and 218a may be proximate to first edge 228 and data pads 212b, 214b, 216b, and 218b may be proximate to third edge 232. In contrast to data pads 204 and data pads 206, data pads 212-218 may be common data pads for common data channels.

Die 202 includes data pads 220-226 including: data pad 220a and data pad 220b which may be common data pads of a first category, data pad 222a and data pad 222b which may be common data pads of a second category, data pad 224a and data pad 224b which may be common data pads of a third category, and data pad 226a and data pad 226b which may be common data pads of a fourth category. Data pads 220-226 include four categories of common data pads for descriptive purposes. Any number of common data pads and any number of categories of common data pads may be included in other embodiments. Data pads 220a, 222a, 224a, and 226a may be proximate to first edge 228 and data pads 220b, 222b, 224b, and 226b may be proximate to third edge 232. In contrast to data pads 204 and data pads 206, data pads 220-226 may be common data pads for common data channels.

In some embodiments, the arrangement of data pads 212a, 214a, 216a, and 218a may be symmetrical to the arrangement of data pads 220b, 222b, 224b, and 226b about axis 244. For example, each of data pads 212a, 214a, 216a, and 218a may be substantially the same distance from first edge 228 as a corresponding one of data pads 220b, 222b, 224b, and 226b is from third edge 232. In some embodiments, all of data pads 212a, 214a, 216a, and 218a may be substantially the same distance from first edge 228 and all of data pads 220b, 222b, 224b, and 226b may be substantially the same distance from third edge 232. In other embodiments, one or more of data pads 212a, 214a, 216a, and 218a may be a first distance from first edge 228 and others of data pads 212a, 214a, 216a, and 218a may be a second distance from first edge 228. In such embodiments, a corresponding one or more of data pads 220b, 222b, 224b, and 226b may be substantially the first distance from third edge 232 and corresponding others of data pads 220b, 222b, 224b, and 226b may be substantially the second distance from third edge 232. Additionally, each of data pads 212a, 214a, 216a, and 218a may be substantially the same distance from fourth edge 234 as a corresponding one of data pads 220b, 222b, 224b, and 226b is from fourth edge 234. For example, data pad 212a may be substantially the same distance from fourth edge 234 as data pad 220b is from fourth edge 234. Further, each of data pads 212a, 214a, 216a, and 218a may be substantially the same distance from axis 246 as a corresponding one of data pads 220b, 222b, 224b, and 226b is from axis 246. For example, data pad 218a may be substantially the same distance from axis 246 as data pad 226b is from axis 246.

In some embodiments, according to layout 200c, the arrangement of data pads 212a, 214a, 216a, and 218a may be symmetrical to the arrangement of data pads 220a, 222a, 224a, and 226a about axis 246. For example, each of data pads 212a, 214a, 216a, and 218a may be substantially the same distance from first edge 228 as a corresponding one of data pads 220a, 222a, 224a, and 226a is from first edge 228. In some embodiments, all of data pads 212a, 214a, 216a, and 218a and data pads 220a, 222a, 224a, and 226a may be substantially the same distance from first edge 228. In other embodiments, one or more of data pads 212a, 214a, 216a, and 218a may be a first distance from first edge 228 and others of data pads 212a, 214a, 216a, and 218a may be a second distance from first edge 228. In such embodiments, a corresponding one or more of data pads 220a, 222a, 224a, and 226a may be substantially the first distance from first edge 228 and corresponding others of data pads 220a, 222a, 224a, and 226a may be substantially the second distance from first edge 228. Additionally, each of data pads 212a, 214a, 216a, and 218a may be substantially the same distance from fourth edge 234 as a corresponding one of data pads 220a, 222a, 224a, and 226a is from second edge 230. For example, data pad 212a may be substantially the same distance from fourth edge 234 as data pad 220a is from second edge 230. Further, each of data pads 212a, 214a, 216a, and 218a may be substantially the same distance from axis 246 as a corresponding one of data pads 220a, 222a, 224a, and 226a is from axis 246. For example, data pad 218a may be substantially the same distance from axis 246 as data pad 226a is from axis 246.

In some embodiments, the arrangement of categories of data pads 212a, 214a, 216a, and 218a relative to a top left corner may be the reverse of the arrangement of the categories of data pads 212b, 214b, 216b, and 218b relative to a bottom right corner. For example, data pad 212a (of the first category) may be distance 248 from first edge 228 and data pad 212b (of the first category) may be distance 250 (which may be substantially the same as distance 248) from third edge 232 and data pad 212a may be distance 252 from fourth edge 234 and data pad 212b may be distance 254 (which may be substantially the same as distance 252) from third edge 232. Likewise, data pad 214a (of the second category) may be substantially the same distance from first edge 228 as data pad 214b (of the second category) is from third edge 232 and data pad 214a may be substantially the same distance from fourth edge 234 as data pad 214b is from second edge 230. Further, data pad 218a (of a fourth category) may be distance 256 from first edge 228 and data pad 218b may be distance 258 (which may be substantially the same as distance 256) from third edge 232 and data pad 218a may be distance 260 from axis 246 and data pad 218b may be distance 262 (which may be substantially the same as distance 260) from axis 246.

In some embodiments, all of data pads 212a, 214a, 216a, and 218a may be substantially the same distance from first edge 228. In such embodiments, all of data pads 212b, 214b, 216b, and 218b may be substantially the same distance from third edge 232. In other embodiments, one or more of data pads 212a, 214a, 216a, and 218a may be a first distance from first edge 228 and others of data pads 212a, 214a, 216a, and 218a may be a second distance from first edge 228. In such embodiments, a corresponding one or more of data pads 212b, 214b, 216b, and 218b may be substantially the first distance from third edge 232 and corresponding others of data pads 212b, 214b, 216b, and 218b may be substantially the second distance from third edge 232.

Such an arrangement of data pads 212-218 may allow for common data pads of the same category to be aligned when substantially identical copies of die 202 are rotated and stacked.

Relating FIG. 2A to FIG. 2C, according to the principles and patterns of layout 200c, the layout of data pads of a DW0 region of ChA of FIG. 2A relative to a top left corner of die 274 of FIG. 2A may be the reverse of the layout of dummy data pads of a DW1 region of ChL relative to a bottom right corner of die 274. The result of this layout of data pads and dummy data pads is that when a copy of die 274 is rotated and stacked above die 274, the data pads of DW0 of ChA of die 274 align with the dummy data pads of DW1 of ChL of the copy of die 274. Further, according to the principles and patterns of layout 200c, the dummy data pads of DW0 of ChA of die 274 will align with the data pads of DW1 of ChL of the copy of die 274. The same holds true for DW1 of ChA and DW0 of ChL, DW0 of ChB and DW1 of ChK, etc.

In some embodiments, the layout of data pads and dummy data pads of each DW0 may correspond to the layout of dummy data pads of each DW1 and the layout of dummy data pads of each DW0 may correspond to the layout of data pads of each DW1. Thus, the layout of data pads and dummy data pads within each DW may follow the principles and patterns of layout 200c relative to the DW. For example, each DW may be viewed as a die 202 and may follow the follow the principles and patterns of layout 200c. Similarly, the layout of data pads and dummy data pads within each AW may follow the principles and patterns of layout 200c relative to the AW.

Similarly, according to the principles and patterns of layout 200c, the layout of categories of common data pads of a DW0 region of ChA of FIG. 2A relative to a top left corner of die 274 of FIG. 2A may be the same of the layout of categories of common data pads of a DW1 region of ChL relative to a bottom right corner of die 274. The result of this layout of categories of common data pads is that when a copy of die 274 is rotated and stacked above die 274, the categories of common data pads of DW0 of ChA of die 274 align with the same categories of common data pads of DW1 of ChL of the copy of die 274. The same holds true for DW1 of ChA and DW0 of ChL, DW0 of ChB and DW1 of ChK, etc.

In some embodiments, the layout of categories of common data pads of each DW0 may correspond to the layout of categories of common data pads of each DW1. Thus, the layout of categories of common data pads within each DW may follow the principles and patterns of layout 200c relative to the DW. For example, each DW may be viewed as a die 202 and may follow the follow the principles and patterns of layout 200c. Similarly, the layout of categories of common data pads within each AW may follow the principles and patterns of layout 200c relative to the AW.

Figure 3:
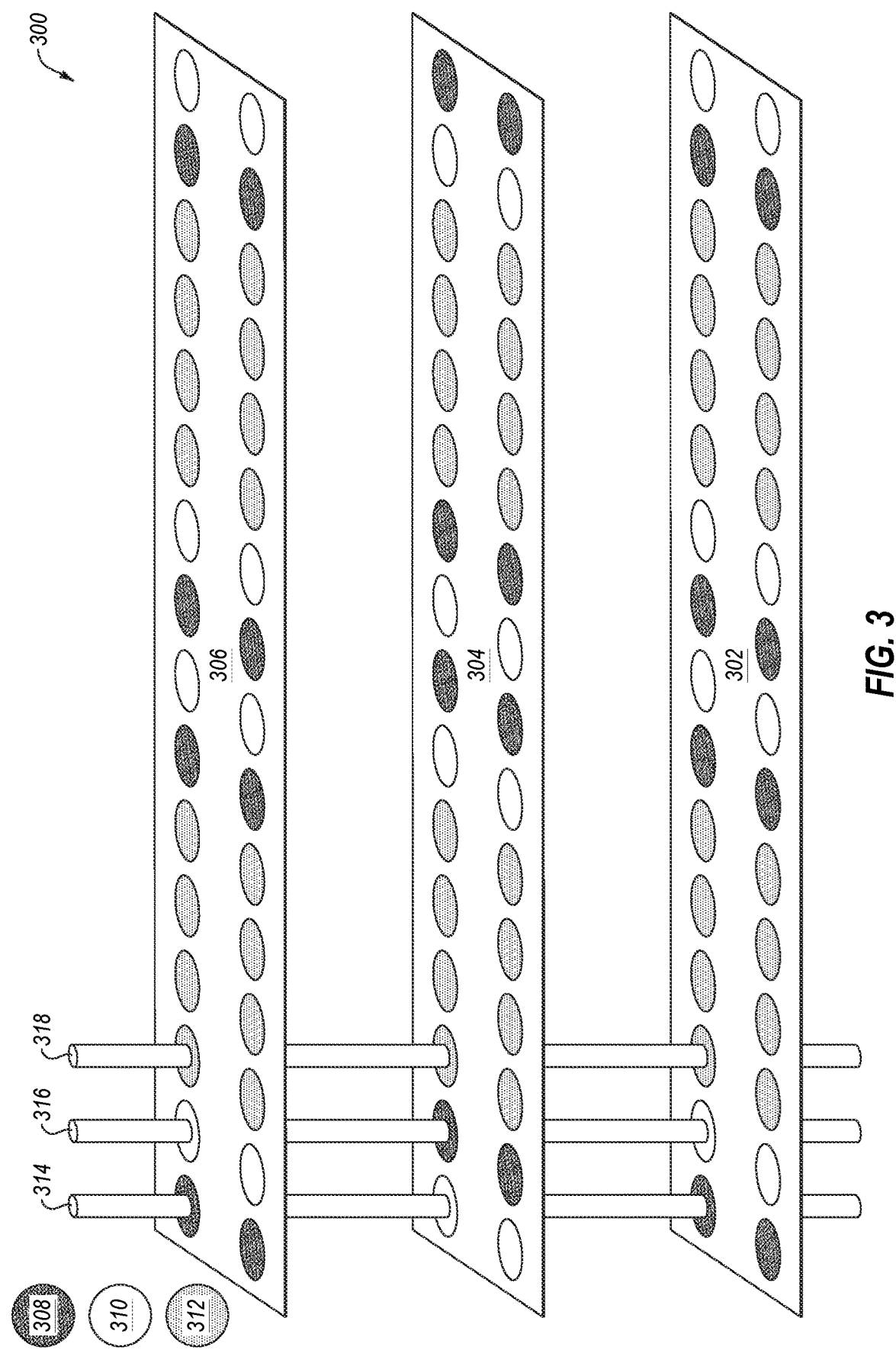
FIG. 3 is a functional block diagram illustrating an example stack of dies in accordance with at least one embodiment of the disclosure.

FIG. 3 is a functional block diagram illustrating an example stack of dies 300 in accordance with at least one embodiment of the disclosure. For example, stack of dies 300 may be referred to as a "memory device" or a "memory system." Each die of stack of dies 300 may be an example of die 202 of FIG. 2C. Stack of dies 300 includes three instances of die 202 rotated relative to one another and stacked. Three dies are illustrated for descriptive purposes. Any number of dies may be included in other embodiments. Stack of dies 300 (with alternative dies rotated 180° relative one another) may allow for data pads of certain dies to align with dummy data pads of alternating dies and/or for alignment of categories of common data pads which may allow for straight inter-layer connections e.g., without lateral-connection portions.

Stack of dies 300 includes die 302 (e.g., a bottom die), die 304 above die 302, and die 306 above die 304. Each die of stack of dies 300 may be substantially identical to each of the others of stack of dies 300. Each die of the stack of dies 300 may be rotated substantially 180° around an axis normal to the bottom die relative to a respective die immediately beneath it. For example, die 304 may be rotated substantially 180° relative to die 302 and die 306 may be rotated substantially 180° relative to die 304.

Each die of stack of dies 300 may include a number of data pads 308, each electrically coupled to a respective circuit (not illustrated) of a respective die on which data pads 308 are located. Data pads 308 may be examples of data pads 204 and data pads 206 of FIG. 2C.

Each die of stack of dies 300 may also include a number of dummy data pads 310 each not electrically coupled to a circuit of the respective die on which dummy data pads 310 are located. In some embodiments, dummy data pads 310 may be electrically isolated with respect to the die on which the dummy data pads are located. For example, dummy data pads 310 on die 302 may be electrically isolated with respect to die 302. The number of dummy data pads 310 may be arranged relative to the number of data pads 308 such that each of the number of dummy data pads 310 of each die of the stack of dies 300 may align with a respective data pad of the number of data pads 308. Dummy data pads 310 may be examples of dummy data pads 208 and dummy data pads 210 of FIG. 2C.

For example, die 302 may include one or more first data pads proximate to a top left corner of the die, one or more first dummy data pads proximate to the top left corner, one or more second data pads proximate to a bottom right corner of the die, and one or more second dummy data pads proximate to the bottom right corner. First positions of the first data pads relative to the top left corner may correspond to second positions of the second dummy data pads relative to the bottom right corner and third positions of the first dummy data pads relative to the top left corner may correspond to fourth positions of the second data pads relative to the bottom right corner.

Because data pads 308 of a die of stack of dies 300 align with dummy data pads 310 of adjacent dies of stack of dies 300, straight inter-layer connections may electrically couple dummy data pads 310 and data pads 308 of adjacent dies of stack of dies 300. For example, inter-layer connection 316 may electrically couple a dummy data pad 310 of die 302 to a data pad 308 of die 304 and to a dummy data pad 310 of die 306.

Data pads and inter-layer connections may be implemented such that each die of stack of dies 300 is associated with one or more inter-layer connections to provide one or more independent data channel for each die of stack of dies 300. For example, inter-layer connections may electrically couple all of data pads 308 of die 302 with all of data pads 308 of die 306. An accessing device may be configured to access die 302 through certain inter-layer connections and to access die 306 through other inter-layer connections.

Additionally or alternatively, each die of stack of dies 300 may include data pads 312. Data pads 312 may be common data pads of various categories. Data pads 312 may be arranged such that each of data pads 312 of each die of stack of dies 300 aligns with a respective one of the data pads 312 of the respective die immediately beneath the die. For example, each of data pads 312 of die 302 align with each of data pads 312 of die 304 which also align with each of data pads 312 of die 306.

The arrangement of categories of data pads 312 may be such that each of data pads 312 of a first category of each die of stack of dies 300 aligns with a respective one of the data pads 312 of the first category of the respective die immediately beneath the die. Further, each of data pads 312 of a second category of each die of stack of dies 300 aligns with a respective one of the number of data pads 312 of the second category of the respective die immediately beneath the die. For example, of data pads 312 of each die of stack of dies 300, a top-left-most data pad may be of a first category. Further, of data pads 312 of each die of stack of dies 300, a second-to-left-most data pad may be of a second category. Thus, inter-layer connection 318 may electrically couple to data pads 312 of a first category of all dies of stack of dies 300 and another inter-layer connection (not illustrated) may electrically couple to all data pads 312 of a second category.

Figure 4:
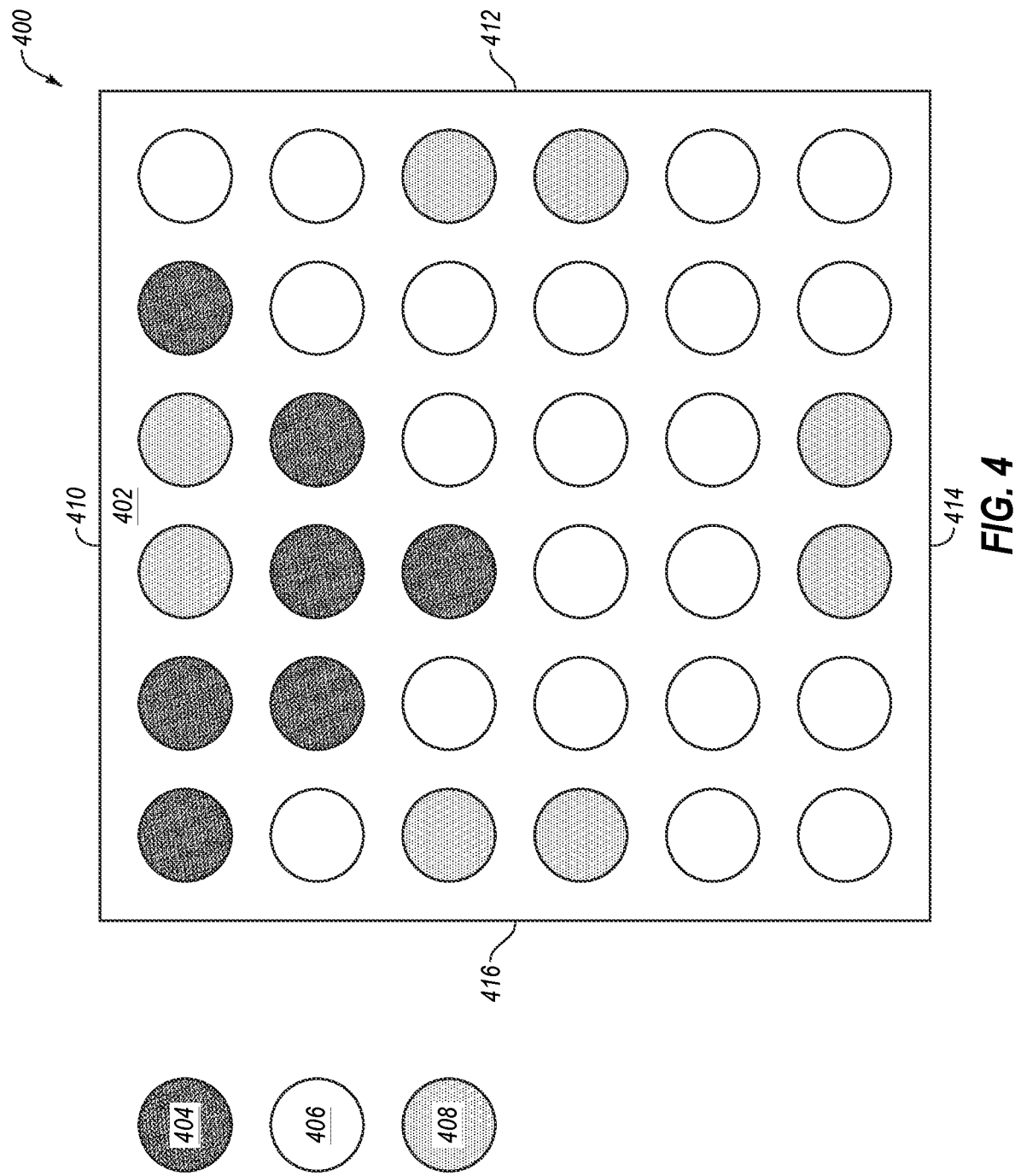
FIG. 4 is a functional block diagram illustrating another example layout of data pads, dummy data pads, and common data pads on an example die in accordance with at least one embodiment of the disclosure.

FIG. 4 is a functional block diagram illustrating an example layout 400 of data pads and dummy data pads on a die 402 in accordance with at least one embodiment of the disclosure. Layout 400 may allow for multiple instances of die 402 to be rotated relative to one another and to be stacked. A stack of instances of die 402 (with alternative dies rotated 90° relative one another) may allow for alignment of data pads and dummy data pads and/or alignment of categories of common data pads which may allow for straight inter-layer connections e.g., without lateral-connection portions.

Die 402 may include one or more memory arrays (e.g., memory array 102 of FIG. 1; not illustrated in FIG. 4). The data pads of die 402 may provide for data channels for the memory arrays. For example, the data pads may be electrically coupled to various inputs and/or outputs of the memory arrays.

Die 402 includes a first edge 410, a second edge 412, a third edge 414, and a fourth edge 416.

Die 402 includes a number of data pads 404 each of which may be electrically coupled to a respective circuit of die 402. Data pads 404 may be arranged proximate to first edge 410. In FIG. 4, seven data pads 404 are illustrated for descriptive purposes. Other numbers of data pads 404 may be included in other embodiments.

Die 402 includes dummy data pads 406 not electrically coupled to a circuit of die 402. In some embodiments, dummy data pads 406 may be electrically isolated. Dummy data pads 406 includes a first number of dummy data pads 406 arranged proximate to second edge 412, a second number of dummy data pads 406 arranged proximate to third edge 414, and a third number of dummy data pads 406 arranged proximate to fourth edge 416. In FIG. 4, twenty-one dummy data pads 406 are illustrated for descriptive purposes. Other numbers of dummy data pads 406 may be included in other embodiments.

The arrangement of the dummy data pads 406 relative to each of second edge 412, third edge 414, and fourth edge 416 may be symmetrical to the arrangement of data pads 404 relative to first edge 410. For example, a first data pad may be a first distance from first edge 410 and a second distance from fourth edge 416. A corresponding dummy data pad may be substantially the first distance from second edge 412 and substantially the second distance from first edge 410. Another corresponding dummy data pad may be substantially the first distance from third edge 414 and substantially the second distance from second edge 412. And another corresponding dummy data pad may be substantially the first distance from fourth edge 416 and substantially the second distance from third edge 414.

Such an arrangement of data pads 404 and dummy data pads 406 may allow for data pads of a first die to be aligned with dummy data pads of a second die, a third die, and a fourth die when substantially identical copies of die 402 are rotated and stacked.

Die 402 further includes data pads 408. Data pads 408 may be common data pads, e.g., of different categories. For example, of data pads 408 proximate to first edge 410, the data pad on left may be of a first category and the data pad on the right may be of a second category. Further, of data pads 408 proximate to second edge 412, the top data pad may be of the first category and the bottom data pad may be of the second category. Further, of data pads 408 proximate to third edge 414, the data on the right may be of the first category and the data pad on the left may be of the second category. Further, of data pads 408 proximate to fourth edge 416, the bottom data pad may be of the first category and the top data pad may be of the second category.

Such an arrangement of data pads 408 may allow for the same categories of data pads 408 to be aligned when multiple substantially identical copies of die 402 are rotated and stacked.

Figure 5:
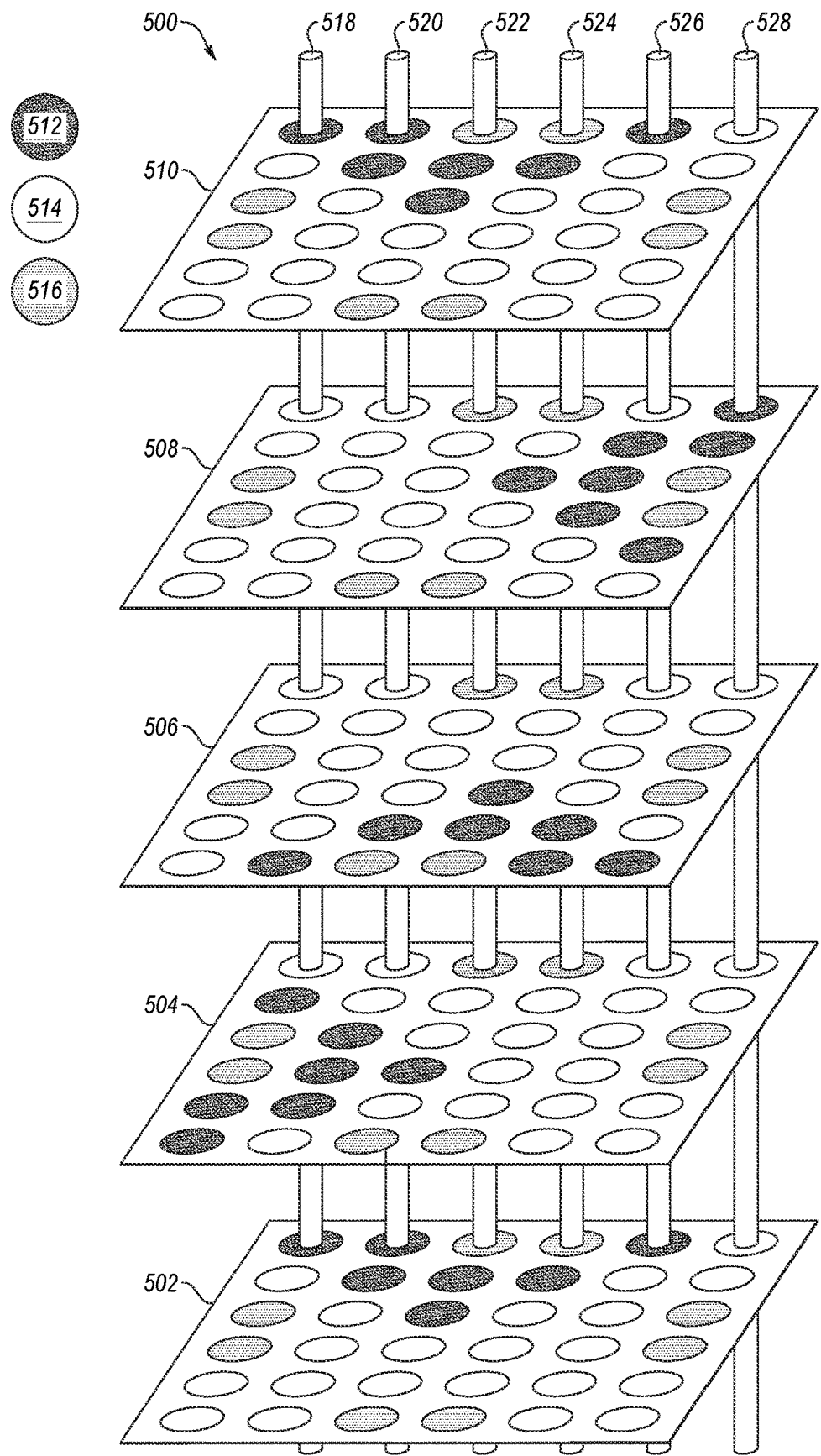
FIG. 5 is a functional block diagram illustrating another example stack of dies in accordance with at least one embodiment of the disclosure.

FIG. 5 is a functional block diagram illustrating an example stack of dies 500 in accordance with at least one embodiment of the disclosure. For example, stack of dies 500 may be referred to as a "memory device" or a "memory system." Each die of stack of dies 500 may be an example of die 402 of FIG. 4. Stack of dies 500 includes five instances of die 402 rotated relative to one another and stacked. Five dies are illustrated for descriptive purposes. Any number of dies may be included in other embodiments. Stack of dies 500 (with alternative dies rotated 90° relative one another) may allow for data pads of certain dies to align with dummy data pads of other dies and/or for alignment of categories of common data pads which may allow for straight inter-layer connections e.g., without lateral-connection portions.

Stack of dies 500 includes a die 502, a die 504, a die 506, a die 508, and a die 510. Each die of stack of dies 500 may be substantially identical to each of the other dies of stack of dies 500. Each die of the stack of dies 500 may be rotated substantially 90° around an axis normal to the bottom die relative to a respective die immediately beneath the die. For example, die 504 may be rotated substantially 90° relative to die 502 and die 506 may be rotated substantially 90° relative to die 504.

Each die of stack of dies 500 may include a number of data pads 512 each of which may be electrically coupled to a respective circuit of the respective die on which data pads 512 are located. Data pads 512 may be examples of data pads 404 of FIG. 4.

Each die of stack of dies 500 may also include a number of dummy data pads 514 not electrically coupled to a circuit of the die on which dummy data pads 514 are located. The number of dummy data pads 514 may be arranged relative to the number of data pads 512 such that each of the number of dummy data pads 514 of each die of the stack of dies 500 may align with a respective data pad of the number of data pads 512. Dummy data pads 514 may be examples of dummy data pads 406 FIG. 4.

For example, die 502 may include one or more first data pads proximate to a first edge, one or more first dummy data pads proximate to a second edge, one or more second dummy data pads proximate to a third edge, and one or more third dummy data pads proximate to a fourth edge. First positions of the first data pads relative to the first edge may correspond to: second positions of the first dummy data pads relative to the second edge, third positions of the second dummy data pads relative to the third edge, and fourth positions of the third dummy data pads relative to the fourth edge.

Because data pads 512 of a die of stack of dies 500 align with dummy data pads 514 of at least some other dies of stack of dies 500, straight inter-layer connections may electrically couple dummy data pads 514 and data pads 512. For example, inter-layer connection 528 may electrically couple a dummy data pad of die 510, a data pad of die 508, a dummy data pad of die 506, a dummy data pad of die 504, and a dummy data pad of die 502.

Data pads and inter-layer connections may be implemented such that each die of stack of dies 500 is associated with a one or more inter-layer connections to provide one or more independent data channels for each die of stack of dies 500. For example, inter-layer connections may electrically couple all of data pads 512 of die 502 with all of data pads 512 of die 510. An accessing device may be configured to access die 502 through certain inter-layer connections and to access die 510 through other inter-layer connections. For example, all of inter-layer connection 518, inter-layer connection 520, and inter-layer connection 526 may electrically couple to data pads of die 502 and die 510. An accessing device may determine to access a memory array of die 502 through inter-layer connection 518 and to access a memory array of die 510 through inter-layer connection 520.

Additionally or alternatively, each die of stack of dies 500 may include data pads 516. Data pads 516 may be common data pads of various categories. Data pads 516 may be arranged such that each of data pads 516 of each die of stack of dies 500 aligns with a respective one of the data pads 516 of the respective die immediately beneath the die. For example, each of data pads 516 of die 502 align with each of data pads 516 of die 504, which also align with each of data pads 516 of die 506, which also align with each of data pads 516 of die 508, which also align with each of data pads 516 of die 510.

The arrangement of categories of data pads 516 may be such that each of data pads 516 of a first category of each die of stack of dies 500 aligns with a respective one of the data pads 516 of the first category of the respective die immediately beneath the die. Further, each of data pads 516 of a second category of each die of stack of dies 500 aligns with a respective one of the number of data pads 516 of the second category of the respective die immediately beneath the die. For example, of data pads 516 of each die of stack of dies 500: of data pads 516 proximate to a first edge, a left data pad may be of a first category and a right data pad may be of a second category, of data pads proximate to a second edge, the top data pad may be of the first category and the bottom data pad may be of the second category, of data pads 408 proximate to a third edge, the right data pad may be of the first category and the left data pad may be of the second category, and of data pads 408 proximate to a fourth edge, the bottom data pad may be of the first category and the top data pad may be of the second category. Thus, inter-layer connection 522 may electrically couple to data pads 516 of a first category of all dies of stack of dies 500 and inter-layer connection 524 may electrically couple to all data pads 516 of a second category.

Figure 6:
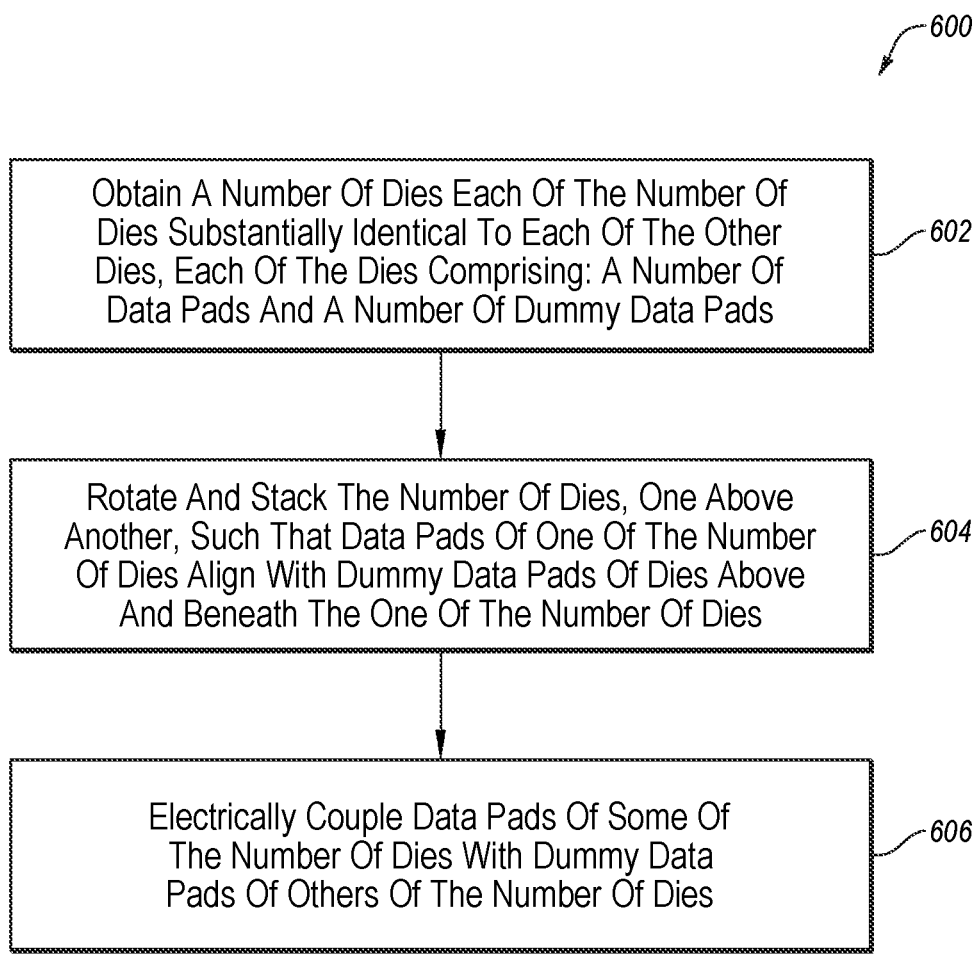
FIG. 6 illustrates an example method in accordance with at least one embodiment of the disclosure.

FIG. 6 is a flowchart illustrating an example method 600 in accordance with at least one embodiment of the disclosure. Method 600 may be arranged in accordance with at least one embodiment described in the disclosure. Method 600 may be performed, in some embodiments, in forming at least a portion of memory device 100 of FIG. 1, stack of dies 300 of FIG. 3, stack of dies 500 of FIG. 5, memory system 700 of FIG. 7, electronic system 800 of FIG. 8, or another device or system. Although illustrated as discrete blocks, various blocks may be divided into additional blocks, combined into fewer blocks, or eliminated, depending on the desired implementation.

At block 602, a number of dies may be obtained. Each die of the number of dies may be substantially identical to each of the other dies of the number of dies. Each of the dies may include a number of data pads electrically coupled to a respective circuit of the die and a number of dummy data pads not electrically coupled to a circuit of the die. Die 202 (including data pads 204, data pads 206, dummy data pads 208, and dummy data pads 210) of FIG. 2C may be a first example of a die of the number of dies obtained at block 602. Die 402 (including data pads 404 and dummy data pads 406) of FIG. 4 may be a second example of a die of the number of dies obtained at block 602.

At block 604, the number of dies may be rotated and stacked, one above another, such that data pads of one of the number of dies align with dummy data pads of dies above and beneath the one of the number of dies. Stack of dies 300 of FIG. 3 may be a first example of how the dies are rotated and stacked at block 604. For example, rotating and stacking each of the number of dies may include rotating each of the stack of dies (except a bottom die) by substantially 180° relative to a die beneath it. Stack of dies 500 of FIG. 5 may be a second example of how the dies are rotated and stacked at block 604. For example, rotating and stacking each of the number of dies may include rotating each of the stack of dies (except a bottom die) by substantially 90° relative to a die beneath it.

At block 606, data pads of some of the number of dies may be electrically coupled with dummy data pads of others of the number of dies. Further, the dummy data pads of the others of the number of dies may be electrically coupled with data pads of the some of the number of dies. Inter-layer connection 314, inter-layer connection 316, and inter-layer connection 318 of FIG. 3 may be first examples of the inter-layer connections electrically coupling data pads of some of the number of dies and dummy data pads of others of the numbers of dies at block 606. Inter-layer connection 518, inter-layer connection 520, inter-layer connection 522, inter-layer connection 524, inter-layer connection 526, and inter-layer connection 528 of FIG. 5 may be second examples of the inter-layer connections electrically coupling data pads of some of the number of dies and dummy data pads of others of the numbers of dies at block 606.

Modifications, additions, or omissions may be made to method 600 without departing from the scope of the disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 7:
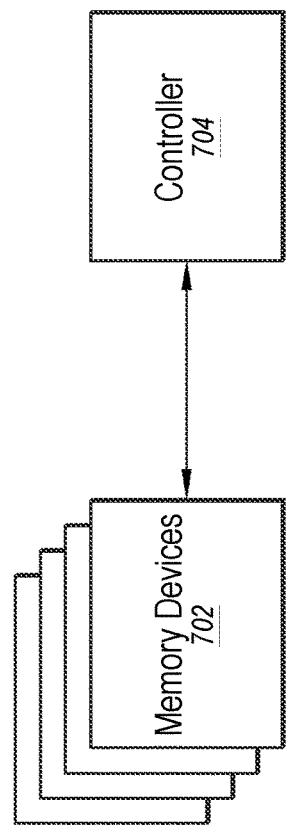
FIG. 7 is a simplified block diagram illustrating an example memory system, in accordance with at least one embodiment of the disclosure.

FIG. 7 is a simplified block diagram illustrating an example memory system 700 implemented in accordance with at least one embodiment of the disclosure. Memory system 700, which may include, for example, a semiconductor device, includes a number of memory devices 702 and a controller 704. Controller 704 may be operatively coupled with memory devices 702 so as to convey command/address signals (e.g., command/address signals received by command terminals 112 and/or address terminals 110 of FIG. 1) to memory devices 702.

At least one of memory devices 702 (e.g., memory device 100 of FIG. 1) and/or controller 704 of memory system 700 may include one or more dies arranged according to layout 200c of FIG. 2C or layout 400 of FIG. 4, according to one or more embodiments disclosed herein.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 8:
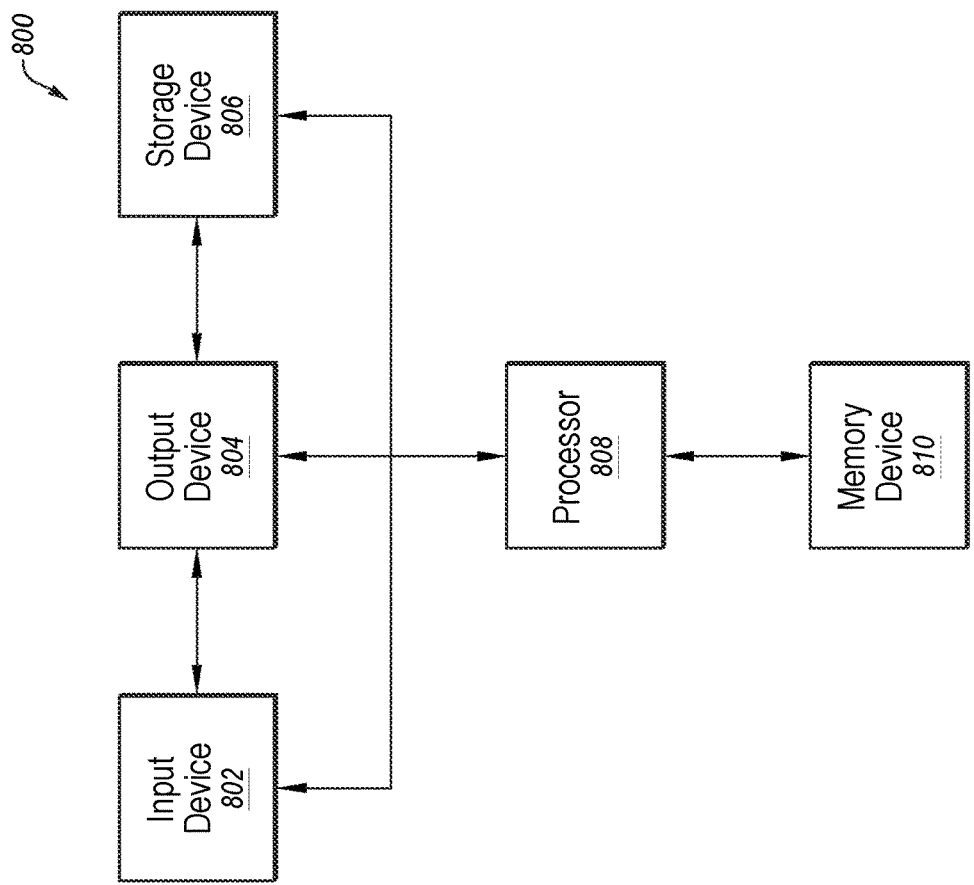
FIG. 8 is a simplified block diagram illustrating an example electronic system, in accordance with at least one embodiment of the disclosure.

FIG. 8 is a simplified block diagram illustrating an electronic system 800 implemented in accordance with at least one embodiment of the disclosure. Electronic system 800 includes at least one input device 802, which may include, for example, a keyboard, a mouse, or a touch screen. Electronic system 800 further includes at least one output device 804, such as a monitor, a touch screen, or a speaker. Input device 802 and output device 804 are not necessarily separable from one another. Electronic system 800 further includes a storage device 806. Input device 802, output device 804, and storage device 806 may be coupled to a processor 808. Electronic system 800 further includes a memory device 810 coupled to processor 808. Memory device 810 may include at least a portion of memory system 700 of FIG. 7. Electronic system 800 may include, for example, a computing, processing, industrial, or consumer product. For example, without limitation, electronic system 800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments may include a die including: a number of circuits, a first edge, a second edge perpendicular to the first edge, a third edge opposite the first edge, and a fourth edge opposite the second edge. The die may also include a first number of data pads variously electrically coupled to the number of circuits. The first number of data pads may be arranged proximate to the first edge. The die may also include a first number of dummy data pads, not electrically coupled to the number of circuits, alternatingly arranged with the first number of data pads, proximate to the first edge, with a first data pad of the first number of data pads proximate to the fourth edge and a first dummy data pad of the first number of dummy data pads proximate to the second edge. The die may also include a second number of data pads variously electrically coupled to the number of circuits. The second number of data pads may be arranged proximate to the third edge. The die may also include a second number of dummy data pads, not electrically coupled to the number of circuits, alternatingly arranged with the second number of data pads, proximate to the third edge, with a second data pad of the second number of data pads proximate to the fourth edge and a second dummy data pad of the second number of dummy data pads proximate to the second edge.

Various embodiments may include a device including dies comprising a bottom die and a number of dies arranged above the bottom die. Each of the dies may be substantially identical to each of the other dies. Each of the number of dies may be rotated substantially 180° around an axis normal to the bottom die relative to a respective die immediately beneath the die. Each of the dies may include a number of circuits, a number of data pads variously electrically coupled to the number of circuits, and a number of dummy data pads not electrically coupled to the number of circuits. The number of dummy data pads may be arranged relative to the number of data pads such that each of the number of dummy data pads of each of the number of dies aligns with a respective data pad of the number of data pads.

Various embodiments may include a device including dies comprising a bottom die and a number of dies arranged above the bottom die. Each of the dies may be substantially identical to each of the other dies. Each of the number of dies may be rotated substantially 90° around an axis normal to the bottom die relative to a respective die immediately beneath the die. Each of the dies may include a number of circuits, a number of data pads variously electrically coupled to the number of circuits, and a number of dummy data pads not electrically coupled to the number of circuits. The number of dummy data pads may be arranged relative to the number of data pads such that each of the number of dummy data pads of each of the number of dies aligns with a respective data pad of the number of data pads.

Various embodiments may include a die including: a number of circuits, a first edge, a second edge perpendicular to the first edge, a third edge opposite the first edge, and a fourth edge opposite the second edge. The die may also include a number of data pads variously electrically coupled to the number of circuits. The number of data pads may be arranged proximate to the first edge. The die may also include: a first number of dummy data pads, not electrically coupled to the number of circuits, arranged proximate to the second edge, a second number of dummy data pads, not electrically coupled to the number of circuits, arranged proximate to the third edge, and a third number of dummy data pads, not electrically coupled to the number of circuits, arranged proximate to the fourth edge. In such embodiments, the number of data pads may include a first data pad a first distance from the first edge and a second distance from the fourth edge, the first number of dummy data pads may include a first dummy data pad substantially the first distance from the second edge and substantially the second distance from the first edge, the second number of dummy data pads may include a second dummy data pad substantially the first distance from the third edge and substantially the second distance from the second edge, and the third number of dummy data pads may include a third dummy data pad substantially the first distance from the fourth edge and substantially the second distance from the third edge.

Various embodiments may include A method including stacking a number of dies such that data pads of one of the number of dies align with dummy data pads of dies above and beneath the one of the number of dies. Each of the number of dies may be substantially identical to each of the other dies. The method may also include electrically coupling data pads of some of the number of dies with dummy data pads of others of the number of dies. Such embodiments may also include rotating, prior to stacking the number of dies, all but a bottom of the number of dies substantially 90° or 180° relative to a die beneath it.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A die comprising:
   a number of circuits;
   a first edge;
   a second edge perpendicular to the first edge;
   a third edge opposite the first edge;
   a fourth edge opposite the second edge;
   a first number of data pads variously electrically coupled to the number of circuits, the first number of data pads arranged proximate to the first edge;
   a first number of dummy data pads not electrically coupled to the number of circuits, alternatingly arranged with the first number of data pads, proximate to the first edge, with a first data pad of the first number of data pads proximate to the fourth edge and a first dummy data pad of the first number of dummy data pads proximate to the second edge;
   a second number of data pads variously electrically coupled to the number of circuits, the second number of data pads arranged proximate to the third edge; and
   a second number of dummy data pads not electrically coupled to the number of circuits, alternatingly arranged with the second number of data pads, proximate to the third edge, with a second data pad of the second number of data pads proximate to the fourth edge and a second dummy data pad of the second number of dummy data pads proximate to the second edge,
   wherein the first number of data pads, the first number of dummy data pads, the second number of data pads, and the second number of dummy data pads are arranged such that if the die were rotated substantially 180° around an axis between the first edge, the second edge, the third edge, and the fourth edge, the first number of data pads would be in first positions formerly occupied by the second number of dummy data pads, the first number of dummy data pads would be in second positions formerly occupied by the second number of data pads, the second number of data pads would be in third positions formerly occupied by the first number of dummy data pads, and the second number of dummy data pads would be in fourth positions formerly occupied by the first number of data pads.

2. The die of claim 1, wherein the first data pad is a first distance from the first edge and a second distance from the fourth edge and wherein the second dummy data pad is substantially the first distance from the third edge and substantially the second distance from the second edge.

3. The die of claim 1, wherein the first number of data pads are all a first distance from the first edge and the second number of dummy data pads are all substantially the first distance from the third edge.

4. The die of claim 1, wherein the arrangement of the first number of data pads and the first number of dummy data pads is symmetrical to the arrangement of the second number of data pads and the second number of data pads about an axis of symmetry that is parallel to the first edge and is between the first edge and the third edge.

5. The die of claim 1, further comprising:
   a third number of data pads variously electrically coupled to the number of circuits, the third number of data pads arranged proximate to the first edge, the third number of data pads comprising a first category of data pads and a second category of data pads, the third number of data pads comprising a third data pad of the first category proximate to the fourth edge and a fourth data pad of the second category proximate to the third data pad; and
   a fourth number of data pads variously electrically coupled to the number of circuits, the fourth number of data pads arranged proximate to the third edge, the fourth number of data pads comprising the first category of data pads and the second category of data pads, the fourth number of data pads comprising a fifth data pad of the first category proximate to the second edge and a sixth data pad of the second category proximate to the fifth data pad.

6. The die of claim 5, wherein the third data pad is a first distance from the first edge and a second distance from the fourth edge and the fifth data pad is substantially the first distance from the third edge and substantially the second distance from the second edge.

7. The die of claim 5, wherein the third number of data pads are all a first distance from the first edge and the fourth number of data pads are all substantially the first distance from the third edge.

8. The die of claim 5, wherein:
the third number of data pads further comprises a seventh data pad of the second category proximate to a center line between the fourth edge and the second edge and closer to the fourth edge than to the second edge, and an eighth data pad of the first category proximate to the seventh data pad; and
the fourth number of data pads further comprises a ninth data pad of the second category proximate to the center line and closer to the second edge than to the second edge, and a tenth data pad of the first category of data pads proximate to the ninth data pad.

9. The die of claim 8, wherein the seventh data pad is a first distance from the first edge and a second distance from the center line and the ninth data pad is substantially the first distance from the third edge and substantially the second distance from the center line.

10. The die of claim 5, wherein the first category of data pads are to communicate a first category of signals and the second category of data pads are to communicate a second category of signals.

11. The die of claim 5, wherein the third number of data pads are arranged in third-data-pad groups, each third-data-pad group including a first-category data pad and a second-category data pad, wherein the third-data-pad groups are arranged between data-pad-and-dummy-data-pad groups comprising the first number of data pads and the first number of dummy data pads.

12. A device comprising:
dies comprising a bottom die and a number of dies arranged above the bottom die, each of the dies substantially identical to each of the other dies, each of the number of dies rotated substantially 180° around an axis normal to the bottom die relative to a respective die immediately beneath the die, each of the dies comprising:
a number of circuits;
a number of data pads variously electrically coupled to the number of circuits; and
a number of dummy data pads not electrically coupled to the number of circuits, the number of dummy data pads arranged relative to the number of data pads such that each of the number of dummy data pads of each of the number of dies aligns with a respective data pad of the number of data pads of other dies arranged above and/or below a given die.

13. The device of claim 12, wherein each of the dies comprises:
a first data pad of the number of data pads proximate to a top left corner of the die;
a first dummy data pad of the number of dummy data pads proximate to the top left corner;
a second data pad of the number of data pads proximate to a bottom right corner of the die; and
a second dummy data pad of the number of dummy data pads proximate to the bottom right corner.

14. The device of claim 13, wherein a first position of the first data pad relative to the top left corner corresponds to a second position of the second dummy data pad relative to the bottom right corner and a third position of the first dummy data pad relative to the top left corner corresponds to a fourth position of the second data pad relative to the bottom right corner.

15. The device of claim 12, wherein the number of data pads comprises a first number of data pads and wherein each of the dies comprises: a second number of data pads arranged such that each of the second number of data pads of each of the number of dies aligns with a respective one of the number of second data pads of the respective die immediately beneath the die.

16. The device of claim 15, wherein each of the second number of data pads is of a category according to a signal to be communicated by the respective data pad and wherein the second number of data pads are arranged such that each of the second number of data pads of a first category of each of the number of dies aligns with a respective one of the number of second data pads of the first category of the respective die immediately beneath the die and each of the second number of data pads of a second category of each of the number of dies aligns with a respective one of the number of second data pads of the second category of the respective die immediately beneath the die.

* * * * *